US010468885B2

(12) United States Patent
Wagoner et al.

(10) Patent No.: US 10,468,885 B2
(45) Date of Patent: Nov. 5, 2019

(54) BATTERY STORAGE SYSTEM WITH INTEGRATED INVERTER

(71) Applicant: GE Energy Power Conversion Technology Ltd, Rugby (GB)

(72) Inventors: Robert Gregory Wagoner, Salem, VA (US); John S Harrison, Salem, VA (US); Lukas Mercer Hansen, Schenectady, NY (US)

(73) Assignee: GE Energy Power Conversion Technology Ltd., Warwickshire (GB)

( * ) Notice: Subject to any disclaimer, the term of this patent is extended or adjusted under 35 U.S.C. 154(b) by 184 days.

(21) Appl. No.: 15/210,607

(22) Filed: Jul. 14, 2016

(65) Prior Publication Data
US 2018/0020578 A1    Jan. 18, 2018

(51) Int. Cl.
*H02J 3/32* (2006.01)
*H05K 7/20* (2006.01)
*H01M 2/10* (2006.01)
*H01M 2/20* (2006.01)
*H02M 7/00* (2006.01)

(52) U.S. Cl.
CPC ............ *H02J 3/32* (2013.01); *H05K 7/20945* (2013.01); *H01M 2/1077* (2013.01); *H01M 2/206* (2013.01); *H02M 7/003* (2013.01)

(58) Field of Classification Search
CPC ........................................................ H02J 3/32
See application file for complete search history.

(56) References Cited

U.S. PATENT DOCUMENTS

2009/0322083 A1* 12/2009 Wagoner ................... H02J 3/38
290/44
2017/0288184 A1* 10/2017 Schnakofsky ...... H01M 2/1077

OTHER PUBLICATIONS

Thien et al. "Planning of grid-scale battery energy storage systems: lessons learned from a 5 MW hybrid battery storage project in Germany." In Proc. BATTCON Int. Battery Conf., pp. 18-1. 2015.*
Tan et al. "Topology and application of bidirectional isolated dc-dc converters." Power Electronics and ECCE Asia (ICPE & ECCE), 2011 IEEE 8th International Conference on. IEEE, 2011.*
Wikipedia contributors. (Sep. 12, 2018). Lockout-tagout. In Wikipedia, The Free Encyclopedia. Retrieved 16:30, Oct. 23, 2018, from https://en.wikipedia.org/w/index.php?title=Lockout-tagout&oldid=859186628.*
Power Continuity (2018). Battery Energy Storage Systems (BESS)—Power Continuity. [online] Power Continuity. from https://powercontinuity.co.uk/knowledge-base/battery-energy-storage-systems-bess/ [Accessed Oct. 23, 2018].*

* cited by examiner

*Primary Examiner* — Daniel J Cavallari
(74) *Attorney, Agent, or Firm* — Wood IP LLC

(57) ABSTRACT

There is provided a power converter unit that can include an inverter and a plurality of batteries. The inverter and the plurality of batteries can be cooled by a common thermal management system. Furthermore, the power converter unit that can include a battery enclosure and the inverter can be co-located with the plurality of batteries inside the battery enclosure.

9 Claims, 5 Drawing Sheets

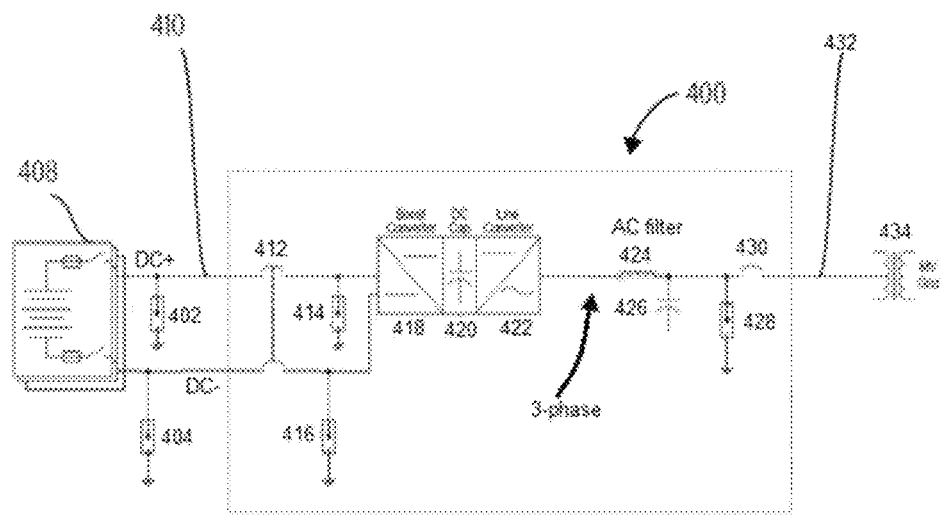
FIG. 4
(Conventional)

BATTERY STORAGE SYSTEM WITH INTEGRATED INVERTER

TECHNICAL FIELD

The present invention relates generally to energy storage. In particular, the present invention relates to improving costs, reliability, and maintainability of battery energy storage systems.

BACKGROUND

In power generation and energy storage applications, an inverter and a battery energy storage system can be connected together to form a power generation unit. Although functioning as one system, the battery energy storage system and the inverter are conventionally disposed at different locations and interconnected with cables. More specifically, the battery energy storage system and the inverter are normally stored in separate enclosures. Additionally, each enclosure includes its own dedicated cooling system, thereby increasing the cost of operation.

The separate enclosures correspondingly increase the complexity. For example, the conventional inverter and battery energy storage systems require extra protection circuits as well as additional subsystems to interface the inverter and battery energy storage system. Due to the complexity in these interfaces, these conventional routinely experience failure in several stages, creating reliability problems. These reliability problems further increase the costs of deploying and maintaining these systems in the field.

SUMMARY

The embodiments featured herein help solve or mitigate the above-noted deficiencies. The embodiments provide at least the following advantages. They reduce the overhead on the cooling hardware required, thus reducing the need for maintenance. Due to their compactness, shipping of the exemplary systems can be more efficient and production costs can be mitigated. Specifically, the total reduction in size and footprint provided by the exemplary systems can reduce length and cost of direct current (DC) wiring. These reductions minimize the need for distributed protection circuitry as well as distributed lock out/tag out (LOTO) devices.

Furthermore, the embodiments can provide added environmental protection for an inverter. Specifically, optimal ambient conditions for the batteries (e.g. about 25 degrees Celsius) in a battery energy storage system are also nearly ideal for the power electronics components included in the inverter. As such, the embodiments can provide an integrated system where both the inverter and the batteries operate under the same controlled environment. In addition to having similar ambient requirements, the inverter and battery energy storage systems can have similarly matched duty cycles. The embodiments can also provide matched duty cycles that allow the inverter and the battery energy storage system to function on the same electrical system, as described in more detail below.

One embodiment provides a power converter unit including an inverter and a plurality of batteries. The inverter and the plurality of batteries are cooled by a common thermal management system. Another embodiment provides a power converter unit including a battery enclosure and an inverter co-located with a plurality of batteries inside the battery enclosure.

Additional features, modes of operations, advantages, and other aspects of various embodiments are described below with reference to the accompanying drawings. It is noted that the present disclosure is not limited to the specific embodiments described herein. These embodiments are presented for illustrative purposes. Additional embodiments, or modifications of the embodiments disclosed, will be readily apparent to persons skilled in the relevant art(s) based on the teachings provided.

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are for purposes of illustrating the embodiments and are not to be construed as limiting the disclosure. Given the following enabling description of the drawings, the novel aspects of the present disclosure should become evident to a person of ordinary skill in the relevant art(s).

FIG. 4 illustrates a circuit according to various aspects disclosed herein.

DETAILED DESCRIPTION

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure would be of significant utility.

Figure 1:
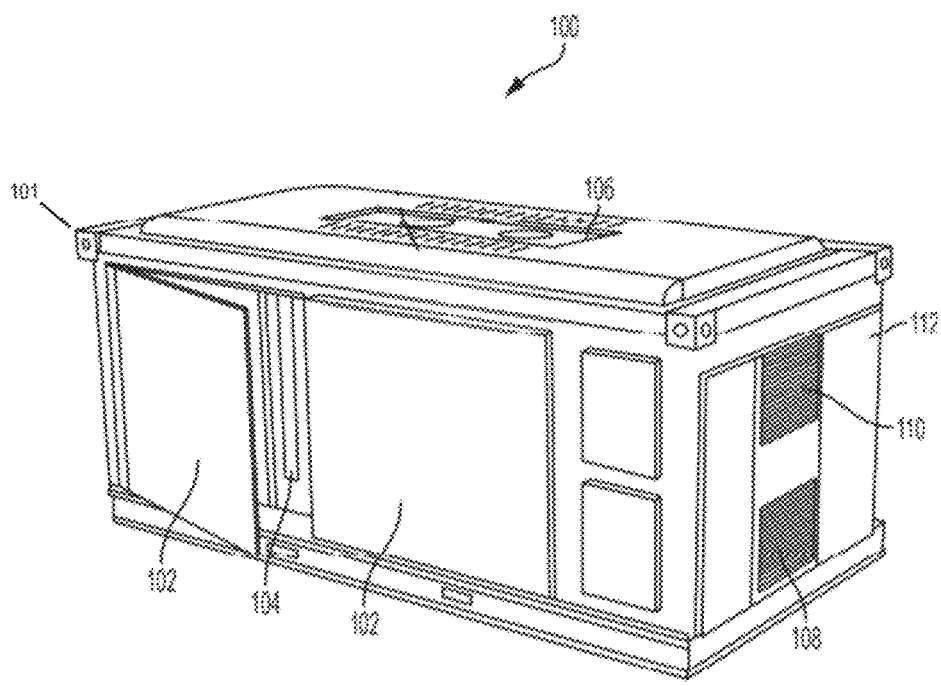
FIG. 1 illustrates a power converter unit, according to an embodiment.

FIG. 1 illustrates a power converter unit 100, according to an embodiment. The power converter unit 100 includes an enclosure 101 that houses a plurality of batteries 104. The enclosure 101 also houses an inverter 112. That is, the plurality of batteries 104 and the inverter 112 are co-located in the single enclosure 101.

The batteries 104 can be distributed in a plurality of battery sections 102 of the enclosure 101. Each section can include racks and cables that respectively support the batteries 104 and provide electrical connections to their terminals.

The power converter unit 100 can further include a thermal management system 106 configured to regulate the temperature inside the enclosure 101. In one embodiment, the thermal management system 106 provides an air flow within the enclosure 101 to cool the plurality of components therein.

At least one component or section of the inverter 112 can be thermally isolated from the thermal management system 106. For example, one section of the inverter 112 can be cooled using outside air or with another thermal management system (not shown). In one example implementation, air vents 108 and 110 are provided on a front panel of a section of the inverter 112. The air vents 108 and 110 can be thermally isolated from other components of the inverter 112 and from the environment inside the enclosure 101. As described below, at least one section of the inverter 112 can be thermally isolated from other sections to optimize the thermal loading.

The at least one thermally isolated section can be a cabinet of the inverter 112 that includes magnetic components. Specifically, the thermal isolation of a magnetics cabinet of the inverter 112 and the return duct collecting heat directly from the IGBT cabinet of the inverter 112 can protect the battery cells from hot spots. When some cells are hotter than others, the internal resistance of the hotter cells increase significantly faster than the cooler cells. This creates an imbalance in the resistance of the multi-parallel strings, which in turn reduces the total energy harvestable from the system. As such, thermal isolation can help mitigate this issue. In sum, the batteries 104 and at least one section of the inverter 112 can be cooled (or thermally managed) together, i.e. by a common thermal management system.

By way of example only, and not limitation, the thermal management system 106 is configurable to set the temperature inside to the enclosure 101 at about 25 degrees Celsius. Generally, the thermal management system 106 can be configured to set the temperature to within a tolerance interval of a nominal temperature. For example, the thermal management system 106 can set the temperature inside the enclosure 101 to 25 degrees Celsius with an allowable tolerance interval of plus or minus five degrees around 25 degrees Celsius.

In the embodiments, the thermal management system 106 can be any cooling system known in the art. For instance, the thermal management system 106 can be a heating, ventilating, and air conditioning (HVAC) system, and can operate utilizing feedback from a thermostat to actively regulate the temperature inside the enclosure 101.

Without limitation, the power converter unit 100 can include a BESS. The BESS can include one to many batteries enclosures, inverters, transformers, switch gears, and controllers needed to operate and protect the BESS when connected to a single interconnection point.

Furthermore, a battery enclosure such as the enclosure 101 can include a plurality of battery modules, battery racks, HVAC systems configured for thermal management. The enclosure 101 could also include a fire suppression system, a building control system, a battery interface cabinet, auxiliary transformers, meters, a low voltage panel, as well as signal and power cabling. Additionally, the plurality of batteries 104 can include one or more lithium ion batteries.

The BESS can be scaled for applications ranging from a fraction of a Mega Watts (MW) to 100 MW to meet power and energy capacity specifications. Meeting such specifications can be tied directly to both characteristics of the power converter unit 100 and the maximum number of such power converter units that a plant controller can drive.

In the embodiments, the inverter 112 can have a minimum power output capacity of 0.25 MW. Thus, when scaling, the minimum incremental size per power converter unit can be 0.25 MW. Typically, a plant controller can drive at most 40 MW. As such, 32 power converters can be used to reach 100 MW, requiring at least three plant controllers.

Figure 2:
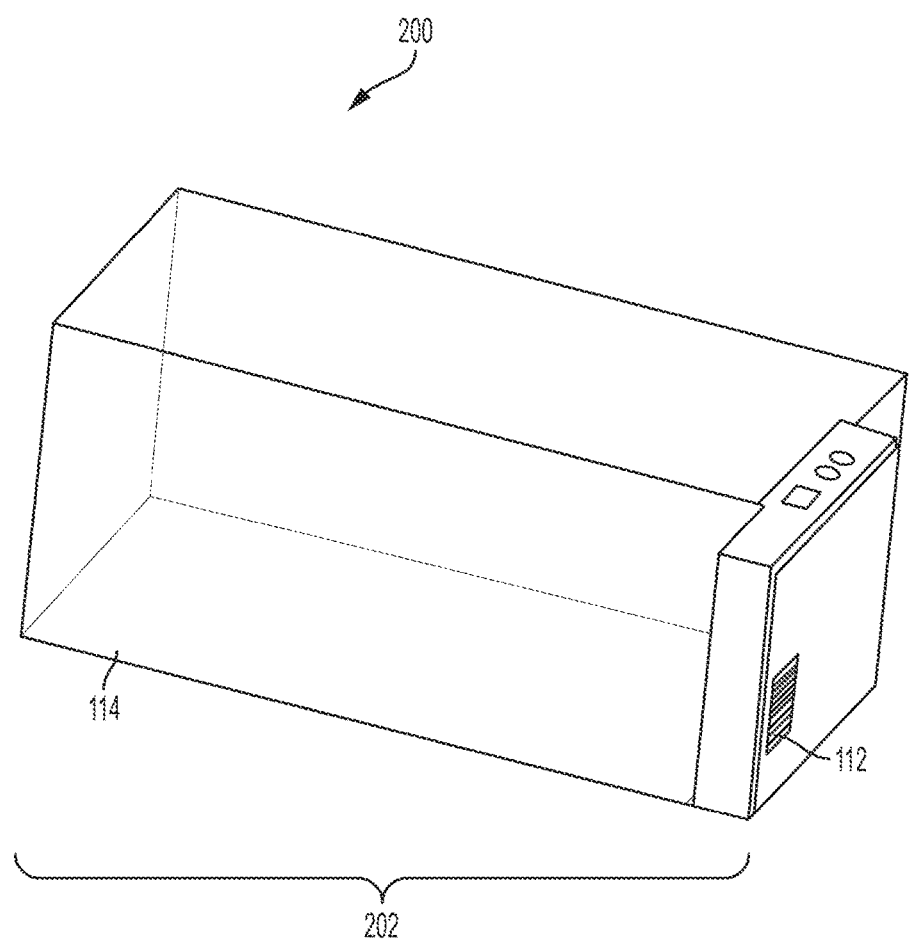
FIG. 2 illustrates a view of a power converter unit, according to an embodiment.

FIG. 2 illustrates a view 200 of the power converter unit 100, according to an embodiment. As shown in FIG. 2, the inverter 112 fits within the enclosure 101 without taking substantially more space than needed to house the plurality of batteries 104. Stated otherwise, viewed from the side, when the power converter unit 100 has a length represented by the bracket 202, a side panel of the inverter 112 consumes only a small portion of that length. As such, by including the inverter 112 within the enclosure as the batteries 104, a single thermal management system can be used to cool both the inverter 112 and the batteries 104. In an embodiment, the inverter 112 occupies about 10% of the volume of the enclosure 101. In other embodiments, the inverter 112 occupies less than 10% of the volume of the enclosure 101. Moreover, the inverter can be placed at an extremity of the enclosure 101, thus allowing for external access of the inverter components.

Figure 3:
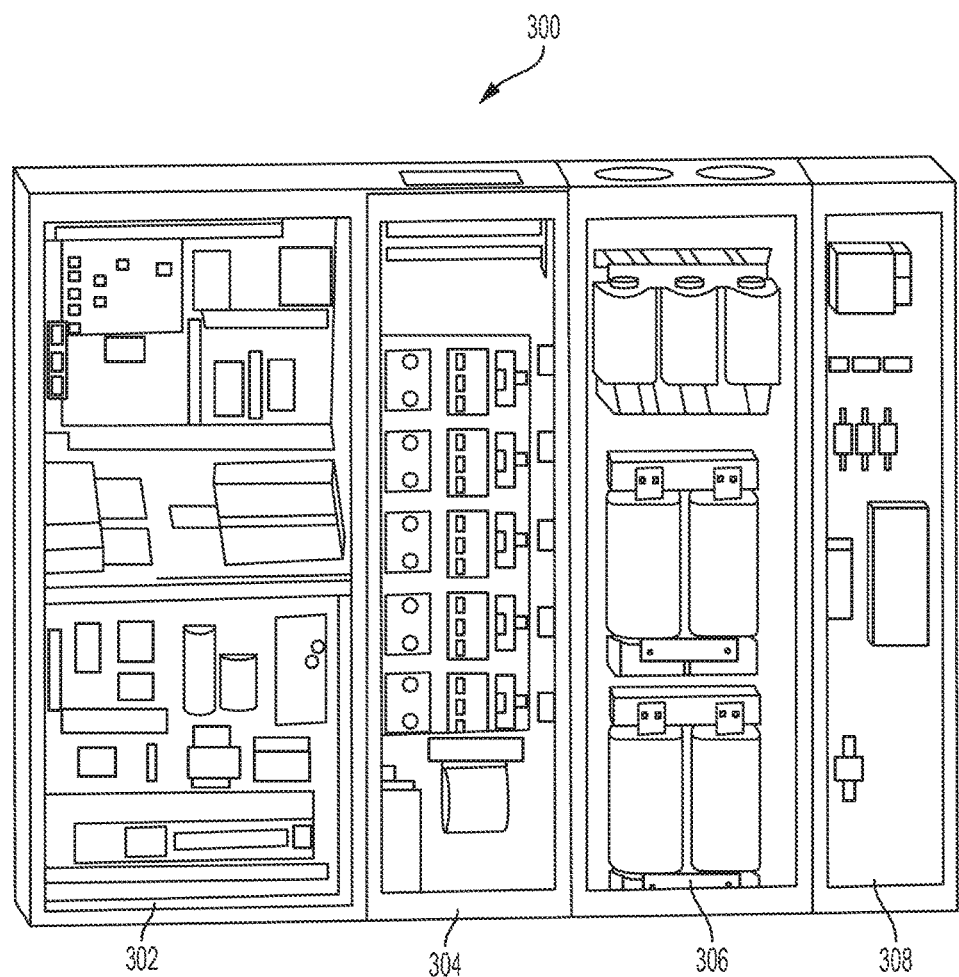
FIG. 3 illustrates an inverter, according to an embodiment.

FIG. 3 depicts a view 300 of the inverter 112, according to an embodiment. Doors or front cover panels of the inverter 112 are not shown in order to illustrate an exemplary implementation. In the example of FIG. 3, the inverter 112 includes a control cabinet 302, a bridge cabinet 304, a magnetic element cabinet 306, and an input output (I/O) cabinet 308. When the inverter 112 is integrated with a battery energy storage system, the inverter 112 may not necessarily have doors or front panels. Doors can be added for additional security.

The control cabinet 302 can include a plurality of components configured to provide functionality to the inverter 112. For example, the control cabinet 302 can include components that interface with an electricity grid to deliver alternating current (AC) power produced by the inverter 112. The control cabinet 302 can also include circuitry for drawing DC power from the batteries 104 to power to other stages of the inverter 112 for subsequent conversion to AC.

The bridge cabinet 304 can include power conversion and signal conditioning circuitry typically found in inverter topologies known in the art. In general, the bridge cabinet 304 can include power electronics elements, such as insulated gate bipolar transistors (IGBTs), flyback diodes, controllers, and the like, which provide power conversion.

The magnetic element cabinet 306 includes a plurality of magnetic elements, such as transformers and inductors. The magnetic elements can be vacuum impregnated with environmental varnish, thus providing more resistance to environmental degradation.

In the exemplary implementation of the inverter 112, the magnetic element cabinet 306 can be thermally insulated from the other cabinets of the inverter 112. That is, the magnetic element cabinet 306 can be thermally isolated from the other constituent parts of the inverter 112.

In the exemplary embodiment of the inverter 112, the thermal time constant for the power electronics components of the bridge cabinet 304, such as IGBTs, can amount to 40% of the total thermal load of the power converter unit 100, and the thermal time constant for the power electronics components must typically be on the order of minutes to ensure proper functioning.

Conversely, the thermal time constant of the magnetic elements can be of the order of hours, and it can also potentially exceed the battery discharge time. Accordingly, thermally isolating the magnetic element cabinet 306 from the other components, specifically from the bridge cabinet 304 and the batteries, can ensure proper thermal management of the inverter 112. Proper thermal management is advantageous since the inverter 112 is co-located with the plurality of batteries 104 and can be managed by a common thermal management system.

The I/O cabinet 308 can include a plurality of input and output hardware that provide one or more interfaces to the other components of the inverter 112. This hardware can be used for measurement, control, and data acquisition, as well as for scheduling, shutting down, and/or resetting of one or more subsystems of the inverter 112.

In FIG. 3, in each of the cabinets shown, temperature-sensitive components can be arranged for receiving cooler air. For example, in the bridge cabinet 304 the components that dissipate the most heat can be placed on the top side of the cabinet so they can receive cooler air by being closer to vents and ducts of the thermal management system 106.

By including the inverter 112 with the batteries 104 in the same enclosure, the embodiments permit cooling the batteries and the power electronics while segregating the magnetic elements into their own cabinet and rejecting their heat to the exterior of the unit (through air vent 108 and 110). This heat exchange at the magnetic element cabinet 306 can be performed by pulling heat from the bottom and rejecting it from the top with minimal filtration. As such, the embodiments allow the cooling loads for an inverter to be nearly halved relative to the cooling loads of typical power conversion units.

The inverter/battery integration provided by the embodiments means that an inverter will be environmentally "ready" for fast start. An inverter placed by itself outdoors must perform environmental checks and must either heat or cool itself for some period of time to make sure the various electronics are in the correct conditions to start operating at full power. In contrast, in the embodiments, the inverter and the batteries can be kept in a thermal zone that is also ideal for the inverter at all times. As such, the inverter can function without ever running additional heating or cooling functions, and without waiting for a dispatch that may allow only a few seconds or even milliseconds to take action without running an additional environmental conditioning system.

The inverter 112 can further include several electrical characteristics that facilitate its integration as part of a battery energy storage system. Moreover, these electrical characteristics can allow the inverter 112 to function as part of the same electrical system as the batteries 104 and their associated support systems.

FIG. 4 illustrates the circuit schematic of an inverter 400 according to a typical configuration where the batteries of a BESS battery bank 408 and the BESS inverter 400 are not co-located. Instead they are housed in two separate cabinets, separated by a distance. The BESS inverter 400 is connected to the BESS battery bank 408 by cables 410. Because of this separation between the two cabinets, protection against a lightning strike must be provided at each end of the cables 410 by lightning protection devices 402, 404, 414 and 416 at each end of the two DC cables 410.

The inverter 400 includes a DC-DC converter 418 configured to regulate DC power for storage in a battery bank 408, and an inverter 422 to condition signals and perform power conversion from DC to 3-phase AC. Between these two sections is a DC capacitor bank 420. Furthermore, there is provided an AC filter that includes inductor 424 and capacitor 426. A DC disconnect switch and/or LOTO device 412 is included between the inverter 400 and the BESS battery bank 408 because of the separation between the two cabinets. Moreover, there is also included a DC disconnect switch and/or LOTO device 430 between the inventor and a MV transformer 434. The BESS inverter 400 and the MV transformer 434 are housed in two separate cabinets, separated by a distance, and connected by cables 432. Consequently, protection against a lightning strike must be provided at each end of cables 432, by lightning protection devices 427 inside BESS inverter 400 and (not shown) inside the MV transformer 434.

Figure 5:
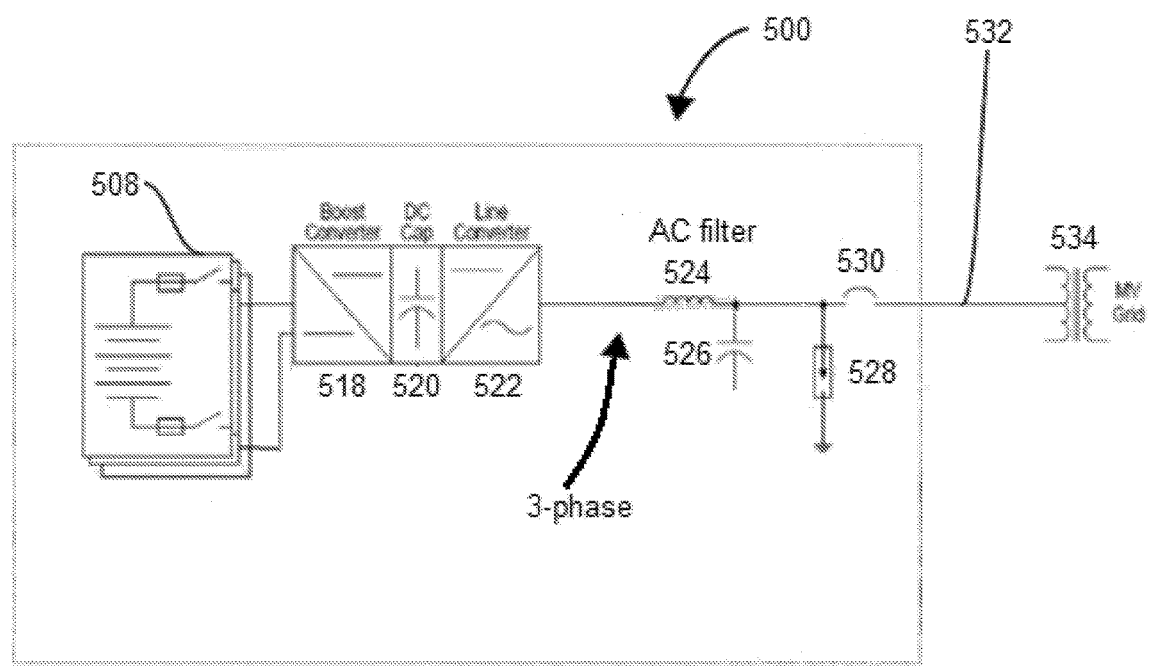
FIG. 5 illustrates an aspect of the subject matter in accordance with one embodiment.

FIG. 5, on the other hand, illustrates an exemplary circuit schematic of an inverter 500, like the inverter 112, co-located with battery bank 508. The inverter 500 includes a DC-DC converter 518 configured to regulate DC power for storage in the battery bank 508, and an inverter 522 to condition signals and perform power conversion from DC to 3-phase AC.

Between these two sections is a DC capacitor bank 520. Furthermore, there is provided an AC filter that includes inductor 524 and capacitor 526. A DC disconnect switch and/or LOTO device 530 is included between the inverter 500 and the battery bank 508, and no other DC switch or LOTO devices are used. As such, in the inverter 500, only one LOTO device 530 is used and only one protection device 528 is used. The inverter 500 is then connected to the MV transformer 534 by a cable 532. Therefore, in the inverter 500, the battery energy storage system 508 and the inverter 522 share at least one protection circuit and share at least one LOTO device. In other words, the inverter 500 can be implemented with fewer components than the inverter 400.

Those skilled in the relevant art(s) will appreciate that various adaptations and modifications of the embodiments described above can be configured without departing from the scope and spirit of the disclosure. Therefore, it is to be understood that, within the scope of the appended claims, the disclosure may be practiced other than as specifically described herein.

What is claimed is:

1. A power converter unit, comprising:
   a plurality of batteries;
   a power electronics portion of an inverter electrically coupled to the plurality of batteries;
   a magnetic portion of the inverter electrically coupled to the power electronics portion; and
   only one disconnect device electrically coupled between the plurality of batteries and the magnetic portion of the inverter, the disconnect device being disposed between the power electronics portion and the magnetic portion;
   wherein only the plurality of batteries, the power electronics portion, and the disconnect device are (i) included within a common enclosure and (ii) cooled by a common thermal management system circulating air only within the common enclosure.

2. The power converter unit of claim 1, further comprising electrical filtering, a control system, a meter, and/or switch gear.

3. The power converter of claim 1, wherein the inverter has a minimum power output of 0.25 MW.

4. The power converter of claim 1, wherein the magnetic portion of formed of a plurality of magnetic elements.

5. The power converter of claim 4, wherein the plurality of magnetic elements include a magnetic element impregnated with environmental varnish.

6. The power converter of claim 3, wherein the plurality of magnetic elements are thermally isolated from other constituent parts of the inverter.

7. The power converter of claim 1, wherein the common enclosure includes a battery rack.

8. The power converter of claim 1, wherein the power electronics portion and the magnetic portion are coupled together via a cable.

9. The power converter of claim 8, wherein the disconnect device is coupled to an end of the cable within the common enclosure.

* * * * *